United States Patent [19]

Taira

[11] 4,446,384
[45] May 1, 1984

[54] MIS DEVICE INCLUDING A SUBSTRATE BIAS GENERATING CIRCUIT

[75] Inventor: Shigenobu Taira, Aizuwakamatsu, Japan

[73] Assignee: Fujitsu Limited, Kawasaki, Japan

[21] Appl. No.: 457,026

[22] Filed: Jan. 10, 1983

Related U.S. Application Data

[63] Continuation of Ser. No. 180,451, Aug. 22, 1980, Pat. No. 4,378,506.

[30] Foreign Application Priority Data

Aug. 27, 1979 [JP] Japan .................. 54-108956

[51] Int. Cl.³ .................. H03K 5/08; H03K 3/01
[52] U.S. Cl. .................. 307/297; 307/453; 307/540
[58] Field of Search .......... 307/297, 304, 303, 453, 307/540, 296 R; 352/41

[56] References Cited

U.S. PATENT DOCUMENTS

| | | | |
|---|---|---|---|
| 3,794,962 | 2/1974 | Jenne | 307/304 |
| 3,932,984 | 1/1976 | Kitamura | 307/304 |
| 4,115,710 | 9/1978 | Lou | 307/304 |
| 4,255,756 | 3/1981 | Shimotori et al. | 307/304 |

Primary Examiner—Stanley D. Miller
Assistant Examiner—B. P. Davis
Attorney, Agent, or Firm—Staas & Halsey

[57] ABSTRACT

A MIS device including a substrate bias generating circuit comprising: an oscillating circuit for generating clock signals; a pumping circuit comprised of a charging and discharging circuit and a bias circuit, for absorbing charges in a semiconductor substrate, and; a clamp circuit for clamping the potential of the substrate at a desired level.

1 Claim, 4 Drawing Figures

MIS DEVICE INCLUDING A SUBSTRATE BIAS GENERATING CIRCUIT

This is a continuation, of application Ser. No. 180,451 filed Aug. 22, 1980, now U.S. Pat. No. 4,378,506 and issued Mar. 29, 1983.

The present invention relates to a semiconductor integrated device and, more particularly, to a MIS (Metal-Insulater-Semiconducter) device including a substrate bias generating circuit.

In general, in an N channel type MIS device, a negative bias voltage is applied to the semiconductor substrate thereof, in order to suppress a source-substrate effect which affects a threshold voltage, i.e., in order to reduce a variation of said threshold voltage and, in addition, to avoid malfunction of the device due to a variation of the potentials of input signals. For this purpose, one external power supply for the negative bias voltage is usually necessary. However, in recent years, a substrate bias generating circuit which is formed in a chip has been developed. A MIS device including such a substrate bias generating circuit therein does not require the above-mentioned external power supply.

Usually, in an N channel type MIS device, positive charges are generated in the substrate due to leakage of currents through p-n junctions between the P type semiconductor substrate and each of a plurality of N type diffusion regions or layers and due to impact ionization. The substrate bias generating circuit comprises a pumping circuit for absorbing such positive charges in the substrate. Thus, the substrate potential remains lower than a predetermined value.

One conventional MIS device including a substrate bias generating circuit comprises an oscillating circuit, a charging and discharging circuit (or an output buffer circuit, a driver circuit) connected to the oscillating circuit and a bias circuit connected to the charging and discharging circuit. The output circuit and the bias circuit serve as a pumping circuit. In this conventional device, a variation of the substrate potential is generated in association with the operation of internal circuits, the variation of a power supply voltage, the variation of a substrate current or the like. In addition, in order to reduce such a variation of the substrate potential, the ability of the pumping circuit, which is dependent upon an oscillating frequency of the oscillating circuit and a capacity of a capacitor included in the bias circuit, is raised.

However, when the ability of the pumping circuit is raised, the threshold voltage of the MIS device is also raised which may cause a low speed of operation of the MIS device, and in addition, the length of an effective channel becomes small, which results in deterioration of static characteristics of the MIS device. In addition, in a static memory device wherein the ability of the pumping circuit is raised and the width of depletion layers of PN junctions in the substrate, electrons of electron-hole pairs which are generated in the substrate due to the penetration of radiant rays such as α-rays thereinto are flown into the depletion layers which may invite destruction of memory information.

It is an object of the present invention to provide a MIS device inluding a substrate bias generating circuit for generating a stable substrate potential, without raising the ability of a pumping circuit.

According to the present invention, there is provided a MIS device including a substrate bias generating circuit for absorbing charges in a semiconductor substrate thereof, comprising: a bias circuit, connected to the semiconductor substrate, which performs charging and discharging operations upon the semiconductor substrate in accordance with clock signals so as to absorb the charges in the semiconductor substrate, and a clamp circuit connected between the semiconductor substrate and a predetermined reference power supply.

According to the present invention, there is also provided a MIS device including a substrate bias generating circuit for absorbing the changes in a substrate thereof, comprising: first and second power supply lines; an oscillating circuit for generating clock signals; a charging and discharging circuit, connected to the first and second power supply lines and to the oscillating circuit, for generating an output signal which has a potential equal to the potential of the first or second power supply line in response to said clock signals; a bias circuit, connected to the charging and discharging circuit, to the substrate and to the second power supply line, for absorbing the charges in the substrate in response to the output signal of the charging and discharging circuit, and; a clamp circuit, connected to the substrate and the second power supply line, for clamping the potential of the substrate. In this device, a current always flows in a loop comprised of the bias circuit and the clamp circuit and, accordingly, the substrate potential is clamped at a desired level.

The present invention will be more clearly understood from the description as set forth below contrasting said invention with the cnventional counterpart and with reference to the accompanying drawings.

Figure 1:
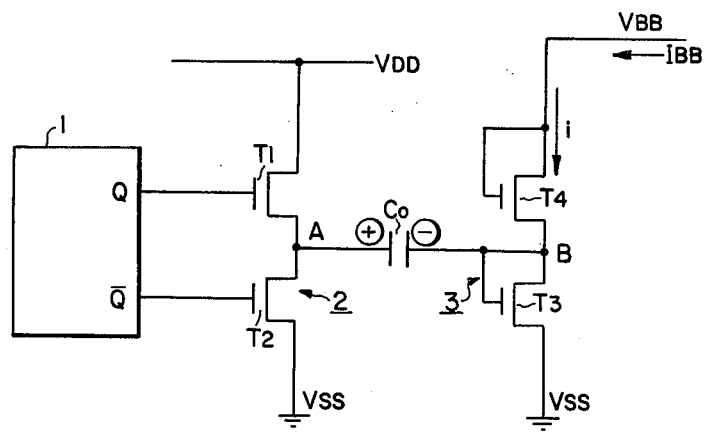
FIG. 1 is a circuit diagram illustrating a conventional substrate bias generating circuit.

In FIG. 1, which illustrates a conventional substrate bias circuit in an N channel type MIS device, an oscillating circuit 1 generates two clock signals which are rectangular and in opposite phases to each other. That is, when the potential of an output terminal Q is high, the potential of an output terminal $\overline{Q}$ is low, while when the potential of the output terminal Q is low, the potential at the output terminal $\overline{Q}$ is high. A charging and discharging circuit 2 (or an output buffer circuit, a driver circuit) which is comprised of two MIS transistors $T_1$ and $T_2$ connected in series drives a bias circuit 3 which is comprised of a capacitor $C_0$ and two diode-connected MIS transistors $T_3$ and $T_4$ in series. The charging and discharging circuit 2 and the bias circuit 3 form one pumping circuit for absorbing positive charges in the semiconductor substrate.

The operation of the circuit of FIG. 1 will now be explained. In FIG. 1, when the potentials of the terminals Q and $\overline{Q}$ are high and low, respectively, the transistors $T_1$ and $T_2$ are, respectively, conductive and nonconductive, so that the potential at a node A is $V_{DD}$. As a result, the transistor $T_3$ is turned on so that the potential at a node B approaches zero and accordingly, the capacitor $C_0$ is charged. In this case, since a substrate potential $V_{BB}$ remains negative, the transistor $T_4$ is nonconductive, in other words, no current flows from the semiconductor substrate to the node B.

Next, when the potentials of the terminals Q and $\bar{Q}$ are changed to low and high, respectively, the transistors $T_1$ and $T_2$ are non-conductive and conductive, respectively. As a result, the potential at the node A approaches zero and simultaneously, the potential at the node B becomes lower than a threshold voltage of the transistor $T_3$, so that the transistor $T_3$ is turned off. In addition, since the transistor $T_3$ is non-conductive, the potential at the node B becomes a negative value which is lower than a value ($V_{BB}-V_{th}$) where $V_{BB}$ and $V_{th}$ are a substrate potential and a threshold voltage of the transistor $T_4$. As a result, the transistor $T_4$ turns on, so that a current i, which is the same as a substrate current $I_{BB}$, flows from the substrate to the node B and accordingly, the substrate potential $V_{BB}$ is decreased. In this circuit, in order to reduce a variation of the substrate potential $V_{BB}$, a pumping ability of the circuit is raised.

In FIG. 1, when the suabstrate potential $V_{BB}$ becomes lower than a value ($|V_{BB}|>|V_{Bmin}|+V_{th}$, where $V_{Bmin}$ is a theoretical minimum value of the potential at the node B), the transistor $T_4$ does not conduct even when the potential at the node A becomes low, that is, the potential at the node B becomes B. Therefore, the impedance of a power supply line whose potential is $V_{BB}$ becomes extremely high, so that the potential $V_{BB}$ is affected by noises.

Contrary to this, in the present invention, the substrate potential $V_{BB}$ is clamped at a desired value ($|V_{BB}|<|V_{Bmin}|+V_{th}$) and therefore, the transistor $T_4$ is always conductive when the potential at the node A is low. As a result, the impedance of said power supply line is relatively low so that the potential $V_{BB}$ is almost unperturred by noises.

Figure 2:
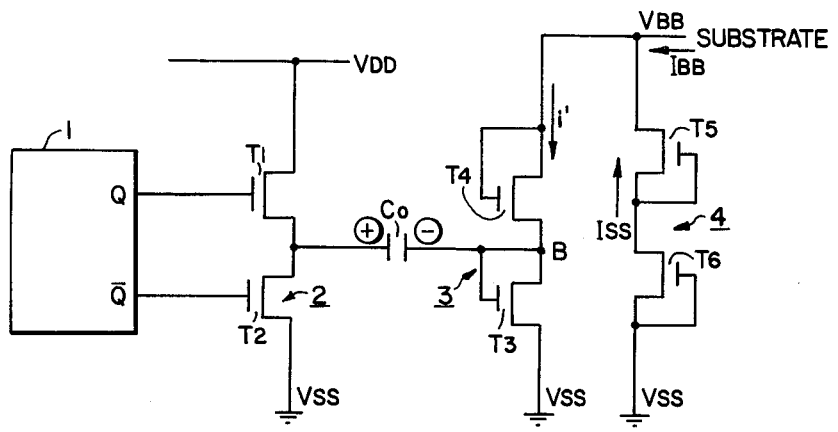
FIG. 2 is a circuit diagram illustrating an embodiment of a substrate bias generating circuit according to the present invention.

FIG. 2 is a circuit diagram illustrating an embodiment of the substrate bias generating circuit according to the present invention. The elements in FIG. 2 which correspond to those of FIG. 1 are denoted by the same reference numerals. In addition, in FIG. 2, a clamp circuit 4 which is comprised of two diode-connected MIS transistors $T_5$ and $T_6$ in series is illustrated. In the clamp circuit 4, when the substrate potential $V_{BB}$ is lower than $-2|V_{th}'|$ where $V_{th}'$ is a common threshold voltage of the transistors $T_5$ and $T_6$, a current $I_{SS}$ flows through the clamp circuit 4. Therefore, the substrate potential $V_{BB}$ remains at a level of nearly $-2|V_{th}'|$. That is, a maximum of the substrate potential $V_{BB}$ is determined by the clamp circuit 4.

In the circuit of FIG. 2, the current $I_{SS}$ is determined by the dimensions of gates of the transistors $T_5$ and $T_6$ and the value of the threshold voltages $V_{th}'$ and accordingly, the current $I_{SS}$ can always be larger than the substrate current $I_{BB}$ ($I_{SS}>>I_{BB}$). In this case, the transistor $T_3$ is always conductive, since the current i' therethrough is defined as ($I_{SS}+I_{BB}$). This is helpful in obtaining a stable substrate current.

In the circuit of FIG. 2, the clamp circuit 4 is comprised of two transistors $T_5$ and $T_6$. However, it should be noted that the clamp circuit 4 can be comprised of one or more diode-connected MIS transistors in series. In addition, the clamp potential $-2V_{th}'$ can be changed easily by changing a quantity of impurities doped in the gate regions of the transistors $T_5$ and $T_6$ of the clamp circuit 4.

Figure 3:
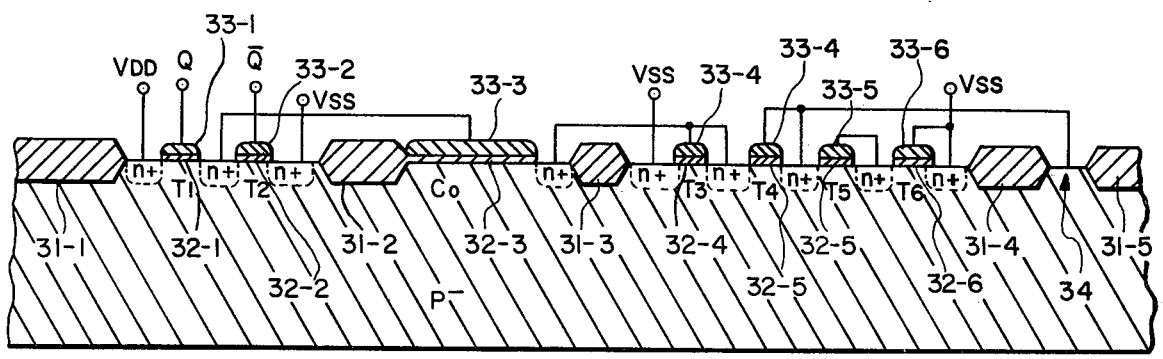
FIG. 3 is a cross-sectional view of a part of a MIS device including the circuit of FIG. 2.

FIG. 3 is a cross-sectional view of a part of a MIS device including the circuit of FIG. 2. In FIG. 3, thick insulating layers 31-1, 31-2, 31-3, 31-4 and 31-5 which made of, for example, silicon dioxide, are formed on a p-type silicon substrate. In addition, thin insulating layers 32-1 through 32-6 made of, for example, silicon dioxide, are formed on the substrate. Further, on each of the thin insulating layers 31-1 through 31-5, first conductive layers 33-1 through 33-6 made of, for example, polycrystalline silicon are formed. There are second conductive layers (not shown) made of, for example, aluminium, between each of said insulating layers and first-conductive layers. It should be noted that an area indicted by 34 is not a N+ type diffusion area. That is, the transistors $T_4$ and $T_5$ are connected directly to the substrate, not through the N+ type diffusion layers.

Figure 4:
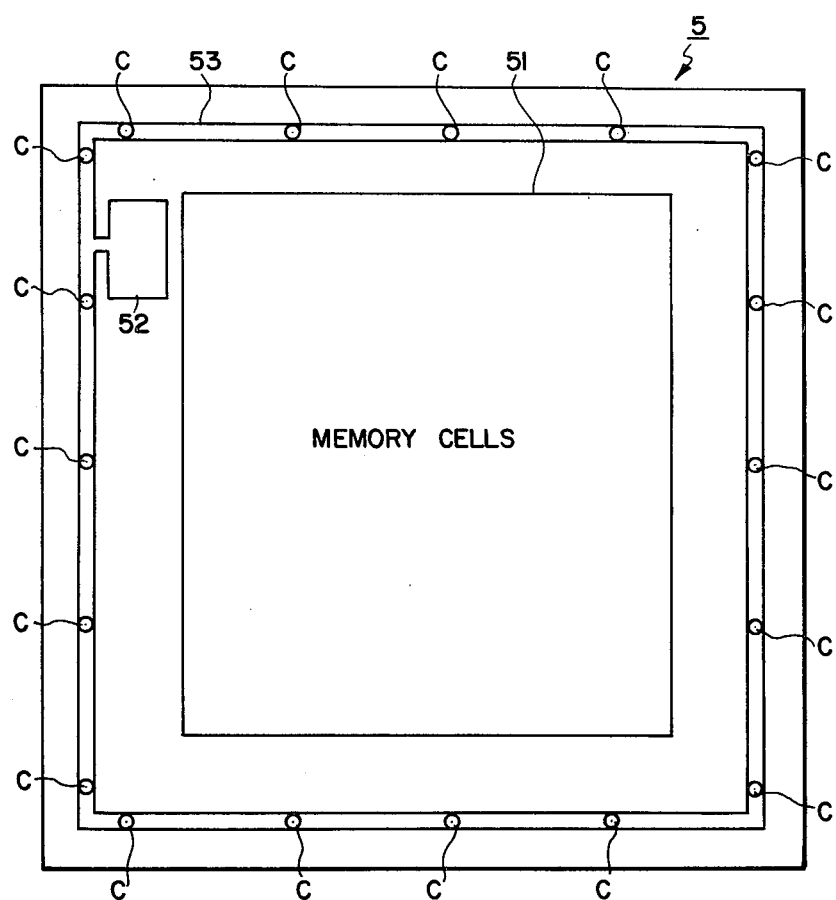
FIG. 4 is a plan view of the whole of a chip of a MIS device including the circuit of FIG. 2.

FIG. 4 is a plan view of the whole of a chip of a MIS device including the circuit of FIG. 2. In FIG. 4, reference numeral 5 indicates a chip of a RAM or ROM. Usually, memory cells 51 are arranged in a central portion of the chip 5, while various circuits (not shown) such as decoders, buffers or the like are arranged on the periphery of the chip 5. Reference numeral 52 indicates an area for the substrate bias generating circuit of FIG. 2. The area 52 is connected to a conductive layer 53 made of, for example, aluminum, which surrounds all the circuits in the chip 5. The conductive layer 53 connects the transistors $T_4$ and $T_5$ of FIG. 2 to the substrate through a plurality of contact throughholes C (which correspond to the area 34 of FIG. 3). Thus, the substrate bias generating circuit of FIG. 2 arranged in the area 52 can absorb positive charges generated in the substrate effectively.

In the above-mentioned embodiment, the present invention is applied to a N channel type MIS device. However, it should be noted that the present invention can be applied to a P channel type MIS device. In this case, negative charges in the substrate are absobed by the substrate bias generating circuit so that the substrate potential remains higher than a predetermined value.

As explained hereinbefore, the MIS device including a substrate bias generating circuit according to the present invention has an advantage, as compared with those of the conventional counterparts, that a substrate potential is more stable, since a clamp circuit clamps the substrate potential at a desired level.

I claim:

1. A MIS device including a substrate bias generating circuit for absorbing charges in a semiconductor substrate thereof, comprising:

a bias circuit, connected to said semiconductor substrate, which performs charging and discharging operations upon said semiconductor substrate in accordance with clock signals so as to absorb said charges in said semiconductor substrate, and a clamp circuit connected between said semiconductor substrate and a predetermined reference power supply, the conductance of said clamp circuit being determined so as to satisfy $I_{SS}>>I_{BB}$ where $I_{BB}$ is a substrate current and $I_{SS}$ is a current flowing through said clamp circuit.

* * * * *

UNITED STATES PATENT AND TRADEMARK OFFICE
CERTIFICATE OF CORRECTION

PATENT NO. : 4,446,384
DATED : May 1, 1984
INVENTOR(S) : Taira

It is certified that error appears in the above-identified patent and that said Letters Patent is hereby corrected as shown below:

Column 2, line 13, "changes" should be --charges--;
Column 2, line 33, "cnventional" should be --conventional--;
Column 2, line 41, ", and;" should be --; and--;
Column 2, line 49, "$\overline{Q}$is" should be --$\overline{Q}$ is--;
Column 2, line 51, "$\overline{Q}$is" should be --$\overline{Q}$ is--;
Column 2, line 62, "$\overline{Q}$are" should be --$\overline{Q}$ are--.
Column 3, line 3, "$\overline{Q}$are" should be --$\overline{Q}$ are--;
Column 3, line 36, "unpertured" should be --unperturbed--.
Column 4, line 5, after "which" insert --are--.

Signed and Sealed this

Nineteenth Day of March 1985

[SEAL]

Attest:

DONALD J. QUIGG

Attesting Officer  Acting Commissioner of Patents and Trademarks